United States Patent [19]

Morioka et al.

[11] Patent Number: 4,609,530
[45] Date of Patent: Sep. 2, 1986

[54] GAAS SINGLE CRYSTAL WITH SMALL FLUCTUATION IN IMPURITY CONCENTRATION IN THE PLANE PERPENDICYLAR TO THE GROWTH DIRECTION OF THE CRYSTAL

[75] Inventors: Mikio Morioka; Atsushi Shimizu, both of Itami, Japan

[73] Assignee: Sumitomo Electric Industries, Ltd., Osaka, Japan

[21] Appl. No.: 682,843

[22] Filed: Dec. 18, 1984

[30] Foreign Application Priority Data

Dec. 23, 1983 [JP] Japan .................. 58-248456

[51] Int. Cl.⁴ .......................... H01L 27/00
[52] U.S. Cl. ..................... 420/555; 148/33; 148/400; 148/404; 156/601
[58] Field of Search ............ 420/555; 148/33, 400, 148/404

[56] References Cited

U.S. PATENT DOCUMENTS 3,496,118 2/1970 Willardson et al. ............ 252/62.3
3,630,906 12/1971 Willardson, et al. ............ 252/62.3

FOREIGN PATENT DOCUMENTS 58-120592 7/1983 Japan .
992029 5/1965 United Kingdom .

OTHER PUBLICATIONS

G. Jacob et al. Isoelectronic Doping of GaAs and InP. J. Crystal Growth, 61, 417–24, 1983.
G. Jacob, Proc. 2nd Int. Conf. Semi. Insulating III–V Compounds, How to Decrease Defect Densities in LEC SI GaAs and InP. Crystal Evian, 1982.
Mil'vidsky, J. Crystal Growth 52, 396–403, 1981.
Mil'Vidsky, "Effect of Doping on Formation of Dislocation Structure in Semiconductor Crystals", Journal of Crystal Growth 52 (1981), 396–403.
G. Jacob, "Dislocation–Free GaAs and InP Crystals by Isoelectronic Doping" Journal of Crystal Growth 61 (1983) 417–424.

Primary Examiner—Veronica O'Keefe
Attorney, Agent, or Firm—Cushman, Darby & Cushman

[57] ABSTRACT

A GaAs single crystal containing at least one impurity selected from the group consisting of B, Si, S, Te and In in a concentration of at least $10^{15}/cm^3$, fluctuation of which is not larger than 20% in a plane perpendicular to a growth direction of the single crystal, which is prepared by pulling up the GaAs single crystal from a GaAs raw material melt contained in a crucible which is encapsulated with a liquid encapsulating layer in an inactive gas atmosphere at a high pressure with applying a magnetic field to the raw material melt.

5 Claims, 6 Drawing Figures

Distance from Wafer Center (mm)

GAAS SINGLE CRYSTAL WITH SMALL FLUCTUATION IN IMPURITY CONCENTRATION IN THE PLANE PERPENDICULAR TO THE GROWTH DIRECTION OF THE CRYSTAL

FIELD OF THE INVENTION

The present invention relates to a GaAs single crystal and preparation thereof. More particularly, it relates to a GaAs single crystal containing an impurity such as B, Si, S, Te and In fluctuation of which is not larger than 20% in a plane perpendicular to a growth direction of the single crystal and preparation thereof.

BACKGROUND OF THE INVENTION

A GaAs single crystal is widely used as a substrate of an element to be used, for example, in optical communication and microwave communication. Further, since it has high electron mobility, a GaAs integrated circuit is intensively being developed.

The GaAs single crystal is practically grown by a boat method or by a liquid encapsulated Czochralski method (hereinafter referred to as "LEC method"). Although there are some other methods for growing the GaAs single crystal, they are laboratory methods and not commercially employed.

(a) LEC Method

By this method, a GaAs single crystal ingot having a circular cross section is prepared and thus material loss is little. In addition, the ingot having a large diameter is easily prepared. Therefore, this method is commercially attractive.

Since the single crystal is grown at a temperature higher than 1,200° C. under a pressure of 2 to 100 atm. by the LEC method, vigorous convection of environmental gas (eg. nitrogen or argon) is generated. $B_2O_3$ encapsulation which prevents dissipation of As has a heat insulating effect. Thus, temperature gradient near an solid-liquid interface reaches an order of 50° to 200° C./cm, and large thermal strain is generated in the grown single crystal, which results in dislocation in the crystal.

Degree of lattice defect in the single crystal is evaluated by etch pit density (hereinafter referred to as "EPD"). The etch pit is a pit which appears when the surface of the single crystal is polished and etched with an appropriate etchant (eg. molten KOH) and corresponds to the lattice defect. EPD is defined as number of the pits per unit area, which is counted by means of a microscope. EPD is sometimes referred to as "dislocation density".

The dislocation density of the GaAs single crystal of 2 to 3 inches in diameter prepared by the LEC method is very high and, for example, from 10,000 to 100,000, which is 10 to 100 times that of a GaAs single crystal prepared by the boat method.

The GaAs single crystal is promising particularly as a substrate of a field-effect transistor (hereinafter referred to as "FET"). This is because a high speed device can be produced with the GaAs single crystal, since it has higher electron mobility than silicon. Many FETs are formed on a wafer by a wafer process to produce an integrated circuit. In such case, all the FETs should have substantially the same pinch-off voltage, which is input voltage when output voltage of FET changes between 0 and 1. If each FET has different pinch-off voltage, it is not suitable for the production of the integrated circuit. The FETs formed on the conventional GaAs substrate has diversely varying pinch-off voltage. This is due to nonuniformly distributed dislocations present in the single crystal.

For the production of the GaAs integrated circuit, it is essential to use a semi-insulating GaAs single crystal which has a very little dislocation density and in which the dislocation is homogeneously distributed.

The generation of dislocation is due to large temperature gradient near the solid-liquid interface. Since a solidified fraction is rapidly cooled by radiation and convection, it shrinks and generates thermal strain in it, which, in turn, generates and propagates the dislocation. Not only the unstability of the solidified fraction but also unstability of the raw material melt causes trouble. The GaAs raw material melt is contained in a crucible which is heated by a carbon heater provided with around it. The carbon heater generates heat by means of a resistor. Since the crucible is heated by the thus generated heat, the temperature of the crucible is higher than that of the raw material melt. Then, the temperature of the upper portion of the raw material melt is not necessarily the same as that of the lower portion. Usually, the temperature of the lower portion which contacts with the crucible is higher than that of the upper portion. A large amount of heat is transferred from the lower portion to the upper portion by heat conduction, thereby the temperature difference is decreased to restore the thermal stability in the melt.

However, when the temperature of the lower portion is too high, that is, the temperature difference is too large, the density of the melt in the lower portion becomes small and the melt tends to rise by convection. Namely, the thermal conduction and convection transfer excessive heat in the lower portion to the upper portion. So long as the thermal conduction predominates, the heat transfer is stationary. However, if the convection predominates it is not stationary.

The ratio of the thermal conduction to the convection is evaluated by Rayleigh number R of the formula:

$$R = g\alpha\beta h^4 / \nu k \quad (1)$$

wherein g is gravitational acceleration, $\alpha$ is a coefficient of cubic expansion of a liquid, $\beta$ is temperature gradient in the vertical direction (the temperature of the lower portion being higher), $\nu$ is a coefficient of kinetic viscosity, k is a diffusion coefficient and h is a height of the melt. The diffusion coefficient k is a value obtained by dividing thermal conductivity by the product of density and specific heat.

When the Rayleigh number exceeds a certain critical value, the state of the liquid changes from a stationary condition to a random one. The critical value depends on a shape of a container. It is to be noted that the Rayleigh number is inversely proportional to the coefficient of kinetic viscosity. In a narrow space like the crucible, as its bottom is heated, the temperature gradient increases and the Rayleigh number reaches the critical value. Then, the content becomes the random condition so that the convection predominates the thermal conduction. By the convection, heat is transferred to the upper portion, thereby the temperature gradient decreases. Therefore, the Rayleigh number diminishes and the melt tends to restore the original stationary condition.

As discussed in the above, the energy of the convection is not always constant but rather varies. Although the temperature distribution in the crucible vigorously changes due to the convection, the temperature of the upper portion of the melt periodically changes due to variation of the energy of convection. The temperature at the solid-liquid interface is equal to the melting point of GaAs, i.e. 1,238° C. However, the level of the interface changes up and down due to the variation of the convection.

(b) High Magnetic Field LEC Method

Due to change of the level of the solid-liquid interface, the growth rate of the single crystal being pulled up varies.

To prevent the variation of the growth rate in the LEC method, it is proposed to suppress the convection in the raw material melt by applying a high magnetic field to the raw material melt (cf. Japanese Patent Kokai Publication (unexamined) No. 120592/1983).

It is presumed that As and Ga atoms moves as charged particles in the melt. The motion of the charged particle is disturbed by the applied magnetic field and the particles cannot go straight on due to Lorentz force to be applied to them, which means practical increase of viscosity. Then, the Rayleigh number decreases and the strength of the convection weaken, so that the thermal conduction predominantly contributes to the thermal equilibrium.

The above method may be called a "high magnetic field LEC method".

When the single crystal pulled up by this method is sliced along a plane including the growth axis and AB (Abrahams Buiocchi) etched with a mixture of $AgNO_3$, $CrO_3$, HF and water to view growth striations, curved stripes almost disappear which are observed in a single crystal pulled up by the conventional method.

The curved stripes are parallel stripes with distance of several microns to several hundred microns and appear in the vertical cross section. They are also called as "growth striations".

Since the growth striations appear also in a non-doped GaAs single crystal, they may be due to the periodical temperature fluctuation at the solid-liquid interface.

Although it is reported that the growth striations disappear in the GaAs single crystal pulled up by the strong magnetic field LEC method, EPD is not improved by this method. According to the hitherto reported data, it cannot be concluded that EPD is decreased by this method.

This may be because that completeness of the experimental facility and technique were insufficient and thus EPD might not be improved. In addition, the applied magnetic field might be too weak.

The present inventors, however, think that the strong magnetic field LEC method cannot effectively improve EPD of the GaAs single crystal. Our ground is as follows:

The strong magnetic field method can reduce the the temperature fluctuation at the solid-liquid interface. However, the dislocation is not immediately generated at the interface but is generated in the solidified fraction pulled up from the interface. Thus, the suppression of the convection in the liquid phase does not lead to the decrease of the dislocation.

In the solidified fraction, the single crystal shrinks. However, the shrinkage is not uniform since the temperature does not uniformly lower in the radial direction. Due to this ununiform shrinkage, the dislocation is generated.

(c) LEC Method with Impurity Doping

It is known that the quality of the GaAs single crystal is improved by doping an impurity. However, the reason why the impurity improves the quality of the single crystal is not theoretically explained. There are many proposals and theories.

There is no definite opinion on which impurity is the best. In addition, the reported data are hardly reproducible and the experiments cannot be traced by others.

(d) Willardson's Theory

Willardson et al proposed to dope the III–V compounds with an impurity so as to increase the electron mobility (cf. U.S. Patent No. 3,496,118 to Willardson et al.). They concluded that the appropriate impurities are Te, Sb, Bi and Pd.

Willardson's theory may be called a "freezing point lowering theory".

When a solute is dissolved in a solvent, a freezing point of the solvent is lowered. Accordingly, the melting point, i.e. freezing point of GaAs is lowered by the doping of the impurity. With the lower melting point, the thermal strain decreases and the single crystal having less defects is prepared. Thus, the more greatly the melting point lowered, the better. Since it is not desirable for the single crystal to contain the impurity, they concluded that the impurity should have the distribution coefficient k much less than 1 (one).

According to Willardson et al, in case of GaAs melt, the distribution coefficients of Sd, Pb, Te and Bi are 0.016, 0.0002, 0.059 and 0.0005, respectively. Therefore, they select the impurity having the distribution coefficient k less than 0.02.

Willardson et al say that the melting point of the GaAs melt can be lowered by 100° C. or more by doping the impurity.

The present inventors think the freezing point lowering theory may be wrong since the melting point of the raw material cannot be lowered by 100° C. or more by the the addition of the impurity.

(e) Mil'vidsky's Theory

Mil'vidsky et al proposed to dope a semi-conductive single crystal with an impurity to decrease defects of the single crystal (cf. Journal of Crystal Growth, 52, 396–403 (1981)).

They think that the dislocation in the single crystal is generated by shear stress due to the thermal strain generated during the cooling step, and that the impurity increases the critical shear stress so that the single crystal becomes harder.

According to Mil'vidsky et al, the shear stress increases in proportional to a value obtained by dividing square of the difference between the volume of the matrix element and that of the impurity element by the diffusion coefficient k.

Mil'vidsky et al describe EPD of the GaAs single crystal of 20 to 25 mm in diameter pulled up by the LEC method. When Te is doped in an amount of $10^{19}/cm^3$, EPD decreases to $10/cm^2$. According to them, next to Te, In and Sn are preferred.

Mil'vidsky et al think that the dislocation linearly propagates but is blocked by the impurity which is present on the propagation line.

The present inventors cannot agree with Mil'vidsky et al.

In a wafer sliced from the single crystal, EPD is large at its periphery and center.

The shape of the single crystal prepared by the LEC method is cylindrical and thus the shear stress at the center should be zero. If the shear stress has great influence on the dislocation, the reason why EPD is large at the center is not explained by the Mil'vidsky theory.

The projection of the stress in the (111) plane on the (110) direction has W figure distribution and thus is not zero at the center. This is the projection of the whole stress. However, the stress at the center is compressive stress.

The propagation of the dislocation line could be blocked by the impurity in the amount of several percents to several tenths percent, but it is unbelievable that EPD of 100,000/cm$^2$ is decreased to 100 to 1,000/cm$^2$.

In addition, the single crystal pulled up by Mil'vidsky et al has a diameter of 20 to 25 mm, which is not suitable for commercial production. If a single crystal having a diameter of 2 to 3 inches is pulled up under the same conditions as such small one is pulled up, the produced single crystal should have large EPD.

(f) Jacob's Experiments

G. Jacob et al disclosed isoelectronic doping of GaAs and InP (cf. Journal of Crystal Growth, 61, 417–424 (1983)).

They pulled up GaAs doped with P, B, In or Sb by the LEC method to obtain 70 to 100 g of a single crystal having a diameter of 15 to 25 mm.

According to their experiments, the single crystal doped with P or B has EPD of 10,000 to 100,000/cm$^2$, which is substantially the same as that of the non-doped one.

When In is doped in GaAs in the form of InAs by 10% by weight, the upper two thirds form a single crystal in which substantially no dislocation is present except a few dislocations in the (100) direction.

Sb is doped as a simple substance or in the form of GaSb. When it is doped in an amount of 5% by weight, the upper one third forms a single crystal in which substantially no dislocation is present except a few dislocations in the (100) direction.

Jacob et al conclude that the distribution coefficient is preferably larger than 1 (one), which is contrary to the conclusion of Willardson et al. When the distribution coefficient k is larger than 1, the whole crystal forms a single crystal. However, when the distribution coefficient k is smaller than 1, only one half or third of the crystal forms a single crystal. This is because the GaAs melt is supercooled and the bottom portion does not form single crystal if the distribution coefficient is smaller than 1.

In any event, the single crystal pulled up by Jacob et al using the LEC method has a small diameter and light weight and thus is not commercially interesting. They say that the single crystal has substantially no dislocation, but it is true for the upper portion of the produced single crystal, since only that portion forms the single crystal.

(g) Jacob's Theory

Jacob proposed some methods for decreasing the lattice defects in GaAs (cf. G. Jacob, "How to Decrease Defect Densities in LEC SI GaAs and InP Crystal", Proceeding 2nd International Conference on Semi-Insulating III–V Compounds, Evian. 1982). In this literature, Jacob proposed following three methods:
(i) Liquid Encapsulated Kyropoulos (LEK) method
(ii) Necking
(iii) Impurity doping.

The LEK method is firstly proposed by Jacob. Since, in the LEC method, the crystal is pulled up out of the liquid encapsulation of B$_2$O$_3$, it is suddenly cooled. On the contrary, in the LEK method, the crystal is cooled to solidify in the liquid encapsulation.

Since the B$_2$O$_3$ melt has small temperature gradient and a heat insulation effect, the temperature distribution in the crystal is rather homogeneous. Therefore, the thermal strain is small so that the single crystal having less EPD is pulled up.

Since the single crystal is solidified in the liquid encapsulation by the LEK method, it is shorter than the depth of the encapsulation. Therefore, the pulled up single crystal ingot is a flat one having a larger diameter but short length. The ingot actually pulled up by Jacob had a diameter of 10 cm and a length of 3 cm.

Jacob says that EPD in the single crystal prepared by the LEK method is about one tenth of that prepared by the LEC method. However, only a small number of wafers are sliced from the ingot prepared by LEK method since the prepared ingot has a short length.

If the depth of the B$_2$O$_3$ melt is deepen and the diameter of the crucible is made large, it is possible to prepare a long ingot. However, the single crystal of larger diameter encounters quite large viscous resistance, since the B$_2$O$_3$ melt has large viscosity. Generally, the single crystal is pulled up with rotation to make the outer diameter uniform. But, since the large viscous resistance makes it difficult to rotate the single crystal, it is difficult to prepare a long crystal. Therefore, the LEK method is not commercially advantageous.

Necking is one of the well known methods, in which the diameter of the single crystal adjacent to a seed crystal is made small and then gradually thicken to form a shoulder. The necking can exclude outward the dislocation propagated from dislocation source included in the seed crystal.

As examples of the impurity doping method, Jacob pulled up GaAs doped with P, In, Sb or B by the LEC method. Among them, one doped with P or B forms a single crystal. However, it has EPD of 10,000 to 100,000/cm$^2$, which is as large as the conventional one.

When In or Sb is doped, the upper two thirds or one half forms single crystal and a part of it contains no dislocation. However, the single crystal has a diameter of 20 mm and a length of 50 to 60 mm.

Jacob says that the critical shear stress defined by Mil'vidsky et al has two meanings, one of which is shear stress for firstly generating the dislocation and another of which is shear stress for propagating the once generated dislocation. These two kinds of shear stress should be distinguished. According to Jacob, the former may be ten times or more larger than the latter.

Jacob explains the reason for hardening of the single crystal by impurity doping of, for example, Si as follows:

In some portions, Ga site is vacant, which is referred to as "Ga vacancy", and in some other portions, the Ga site is replaced by Si, which is referred to as "replaced Si".

When GaAs is aged at a temperature of 400° to 800° C., the hardness of the single crystal increase as time passes. The reason for this is that the replaced Si moves around and interacts with the Ga vacancy to form a replace Si-Ga vacancy pair. By this interaction, the lattice is reinforced.

Similarly, when GaAs is doped with the impurity such as S, Te, Ge, Sn, etc., the impurity replacing the Ga site and the Ga vacancy interact to reinforce the lattice bonding.

The present inventors are against Jacob.

The Ga vacancy should have minus charge since it is formed by removal of Ga from the site at which trivalent Ga should be present. On the other hand, since Si, S, Te, Ge or Sn replacing the Ga site liberates an electron as a free electron, it should have plus charge. Thus, the Coulomb force between the plus and minus charges reinforces the lattice bonding.

However, the reason why the Ga site is replaced with S and Te but the As site is not is uncertain. In addition, such phenomenon occurs only when As is present in excess and Ga is insufficiently present.

Such Coulomb force is not generated by In and Al which is isoelectronic with Ga. Therefore, the Jacob's theory is totally invalid for In and Al. However, the experimental data for In and Al strangely support the theory.

In addition, it is questionable whether the reinforcement of the lattice bonding has any influence on the decrease of dislocation.

Mil'vidsky et al explain that the impurity doping increases the critical shear stress so that the dislocation is suppressed. However, the reinforcement of the lattice bonding does not necessarily lead to the suppression of dislocation. Since the lattice structure is present in the dislocation domain, the reinforcement by Coulomb force also augments the force which generates the dislocation.

SUMMARY OF THE INVENTION

One object of the present invention is to provide a GaAs single crystal containing an impurity such as B, Si, S, Te and In having a diameter not less than 40 mm, for example, 2 or 3 inches.

Another object of the present invention is to provide a GaAs single crystal having EPD not larger than $1 \times 10^4/cm^2$.

Further object of the present invention is to provide a GaAs single crystal in which fluctuation of the impurity is not larger than 20% in a plane perpendicular to a growth direction of the single crystal.

Yet further object of the present invention is to provide a process for preparing the GaAs single crystal of the invention.

According to one aspect of the present invention, there is provided a GaAs single crystal containing an impurity selected from the group consisting of B, Si, S, Te and In in a concentration of at least $10^{15}/cm^3$, preferably at least $10^{17}/cm^3$, fluctuation of which is not larger than 20% in a plane perpendicular to a growth direction of the single crystal.

According to another aspect of the present invention, there is provided a process for preparing the GaAs single crystal of the invention, comprising pulling up a GaAs single crystal from a GaAs raw material melt contained in a crucible which is encapsulated with a liquid encapsulating layer in an inactive gas atmosphere at a high pressure with applying a magnetic field to the raw material melt.

DETAILED DESCRIPTION OF THE INVENTION

As discussed in the above, there are many theories for explaining the mechanism of generation and decrease of EPD in the GaAs single crystal prepared by LEC method but each has its own defects. Therefore, there is no definite theory.

The theory on which the present invention depends is entirely different from the conventional theories.

In the solidified fraction just above the solid-liquid interface which is very similar to the liquid state, when the temperature gradient at the interface is minimized as small as possible, no thermal stress and thus no dislocation is generated. Since heat of the solidified fraction is removed by radiation and convection, it is cooled and shrinks from its periphery.

Now, the distribution of temperature t is approximated to a quadric function of the radius r:

$$t_0 - t = ar^2 \tag{2}$$

The single crystal ingot prepared by the LEC method has a cylindrical form. When the condition of the equation (2) is applied in a cylindrical coordinate, stresses $\sigma t$ and $\sigma r$ in the angle and radial directions, respectively are expressed as follows:

$$\sigma r = -\sigma_0 \left(1 - \frac{r^2}{R^2}\right) \tag{3}$$

$$\sigma t = -\sigma_0 \left(1 - \frac{3m-1}{m-1} \frac{r^2}{R^2}\right) \tag{4}$$

$$\sigma_0 = \left(1 - \frac{1}{m}\right) \frac{a\alpha R^2}{4} \tag{5}$$

wherein R is a radius of the single crystal, $\alpha$ is a linear expansion coefficient and m is Poisson's ratio.

Accordingly, the stress ($\sigma r$) in the radial direction is always negative and maximum at the center of the crystal. The stress ($\sigma t$) in the angle direction is negative, namely compressive stress at the center of the crystal, equal to zero at a certain point and positive, namely tensile stress at the periphery of the crystal.

Since the principal axis of the stress is present in a 45° direction to the radius, the principal stress $\sigma$ and shear stress $\tau$ are expressed as follows:

$$\sigma = -\sigma_0 \left(1 - \frac{2m-1}{m-1} \frac{r^2}{R^2}\right) \tag{6}$$

$$\tau = \frac{\sigma_0 m}{m-1} \frac{r^2}{R^2} \tag{7}$$

Figure 4:
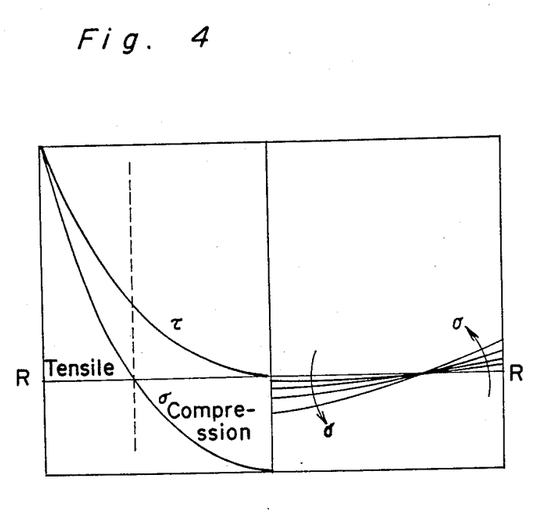
FIG. 4 shows the change of stresses in a cylindrical single crystal, the left half of which is for a non-doped GaAs single crystal and the right half, for a GaAs single crystal doped with an impurity.

The principal stress and the shear stress are shown in the left half of FIG. 4.

Mil'vidsky et al consider only the shear stress, which referred to as thermal stress by Jacob. However, Jacob does not distinguish the positive and negative of the principal stress. Thus, Jacob was not aware of the difference between the positive and negative principal stresses.

These equations represent the strain generated by the temperature difference between the center and periphery of the single crystal which is caused by the fact that the periphery is cooled faster than the center.

When the growth direction is represented by Z and the temperature change in the Z direction is taken into consideration, the equation (2) is replaced by the following equation:

$$t = t_0 - ar^2 - bz \qquad (8).$$

Figure 3:
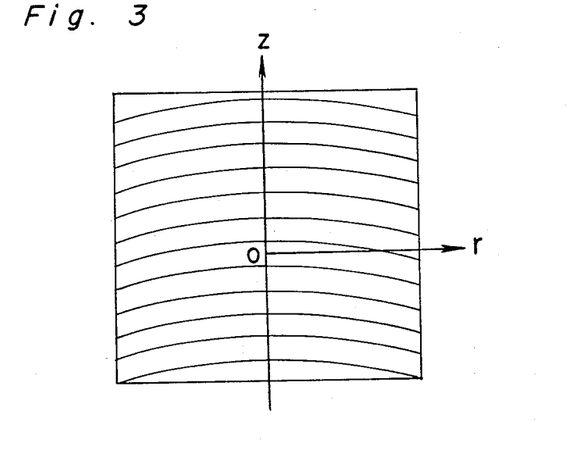
FIG. 3 is a schematic cross sectional view of a single crystal showing the constant temperature lines in it.

If the equation (8) is equalized to a constant, a constant temperature line in the single crystal is drawn. FIG. 3 shows the thus drawn constant temperature lines. The Z axis corresponds to the advancing direction of an upper shaft, and the constant temperature lines forms a group of curves which are convex upwardly.

Heat flows in the direction parallel with lines orthogonal to the constant thermal lines.

If the temperature is disturbed by convection, the growing rate is fluctuated along the constant temperature lines so that the growth strips which correspond to the lines in FIG. 3 are observed when etched by the AB etching.

The difference of the solid and the liquid resides in the presence of the long range order. That is, the liquid has short range order but no long range order, while the solid has long range order.

The In impurity contained in the GaAs melt migrates in the crystal above the solid-liquid interface and may act in the gradually solidified GaAs as follows:

The single crystal pulled up is gradually cooled and tensile stress is generated on the periphery of the solid. In has a larger covalent radius than Ga. In which replaces the Ga site increases the volume to the extent corresponding to its own radius in the liquid phase. However, as the crystal is cooled and the lattice structure is formed, the long range order gradually propagates. In acts on the adjacent lattice units and also those next to them and tends to expand the lattice distances. Thus, the lattice volume near In increases as the crystal is cooled, and the volume increase counterbalances the volume decrease of the GaAs lattice due to cooling. Therefore, the stress at the periphery does not increase.

Since the temperature is lowered more slowly in the inside of the single crystal, it is still flowable even if the covalent bond of In is formed at the periphery. In the inside of the single crystal, the stress is negative and thus compressive.

Figure 5:
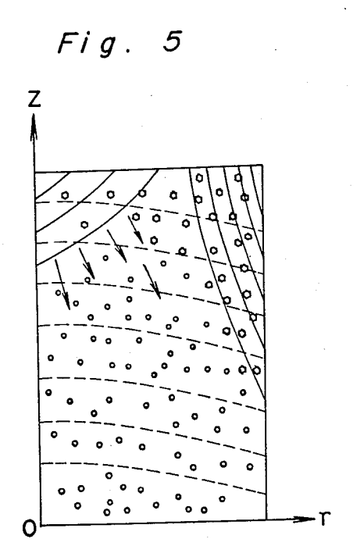
FIG. 5 shows a schematic cross sectional view of a single crystal based on the theory of the present invention.

As In migrates in the GaAs lattice and solidifies, the volume increases. Thus, In is hardly penetrates in the GaAs lattice in the inside in which the stress is compressive and therefore squeezed out to the high temperature region. FIG. 5 explains such idea of the present invention.

The center line and radial direction of the single crystal correspond to the Z and r axes, respectively. Thus, FIG. 5 shows only the right half of the crystal. The broken lines are the constant temperature lines. The temperature is higher at the lower part. At the higher temperature, In more easily flows and is downwardly squeezed by the compressive stress.

The thin solid line represents the uniform distribution of the stress $\sigma$. In the upper right region, the stress is positive, and in the upper left region, negative.

Hexagonal marks represent the bound In elements which replace the Ga sites and form the covalent bonds. These In elements cannot move any longer and remain in the lattice. The small circles represent moving In elements. They are downwardly squeezed by the compressive stress. However, they cannot move at a temperature lower than a certain temperature.

As In is squeezed downwardly, the In concentration in the lower portion increases resulting in the increase of chemical potential. Thus, In in the lower portion is further downwardly squeezed. In this way, most of In near the center of the single crystal being solidified is downwardly squeezed and returned to the melt.

On the other hand, the single crystal is upwardly pulled and, in turn, cooled at a corresponding rate. When the pulling rate, namely the cooling rate is fast, the melt is pulled up in the cooling area before In is thoroughly squeezed. Remained In forms bound In. Therefore, a number bound In remain in the periphery of the single crystal ingot and relax the stress, that is, diminish the linear expansion coefficient. If In near the center remains as such, it augments the stress. However, since the center is still at a high temperature and In in the center is downwardly squeezed, the compressive stress is not augmented. Accordingly, In significantly diminishes the stress in the single crystal due to the temperature difference between the periphery and the center.

The stresses at the periphery and the center are generated at the same time. That is, the tensile stress at the periphery and the compressive stress at the center are simultaneously generated in the same strength. However, the temperatures at the periphery and the center are not the same at the same time. Therefore, the actions of In at the periphery and the center do not counterbalance each other.

The above phenomena are shown in the right half of FIG. 4. At the solid-liquid interface, the stress is zero, which is represented by the horizontal line. As the melt is pulled up away from the interface, the tensile stress is generated at the periphery and the compressive stress, at the center. The arrow represents time elapsing.

As In is bound at the periphery and the lattice begins to expand, the shrinkage by cooling is counterbalanced by the expansion so that the stress does not significantly increase. Correspondingly, the compressive stress at the center does not increase. Therefore, the stress curves do not have such steep slopes as shown in the left half of FIG. 4.

The present invention is based on the above stress relaxation by In.

Since the dislocation is generated and propagated by the stress, it is decreased if the stress is relaxed.

According to the present theory, the stress itself is decreased by the addition of In, while according to Mil'vidsky and Jacob, the lattice structure is hardened and strengthened by the addition of In. Therefore, the wording "impurity hardening" is not suitable for the present invention. Since it is, however, a simple and common wording, it is sometimes used in the specification.

According to the present invention, the GaAs single crystal is pulled up from its melt containing the impurity with applying the magnetic field by utilizing the "impurity hardening" effect of the III group element impurity which are isoelectronic in the GaAs single crystal (eg. In, B, Si, S, Te, or a mixture thereof).

Fundamentally, the process of the invention is based on the LEC method.

The thus prepared single crystal has EPD not larger than $1 \times 10^4/cm^2$, a diameter not less than 40 mm and the impurity concentration of at least $1 \times 10^{15}/cm^3$, preferably at least $1 \times 10^{17}/cm^3$. The single crystal may be conductive (eg. n-type or p-type) or semi-insulating.

The present invention will be illustrated by making reference to the accompanying drawings.

Figure 1:
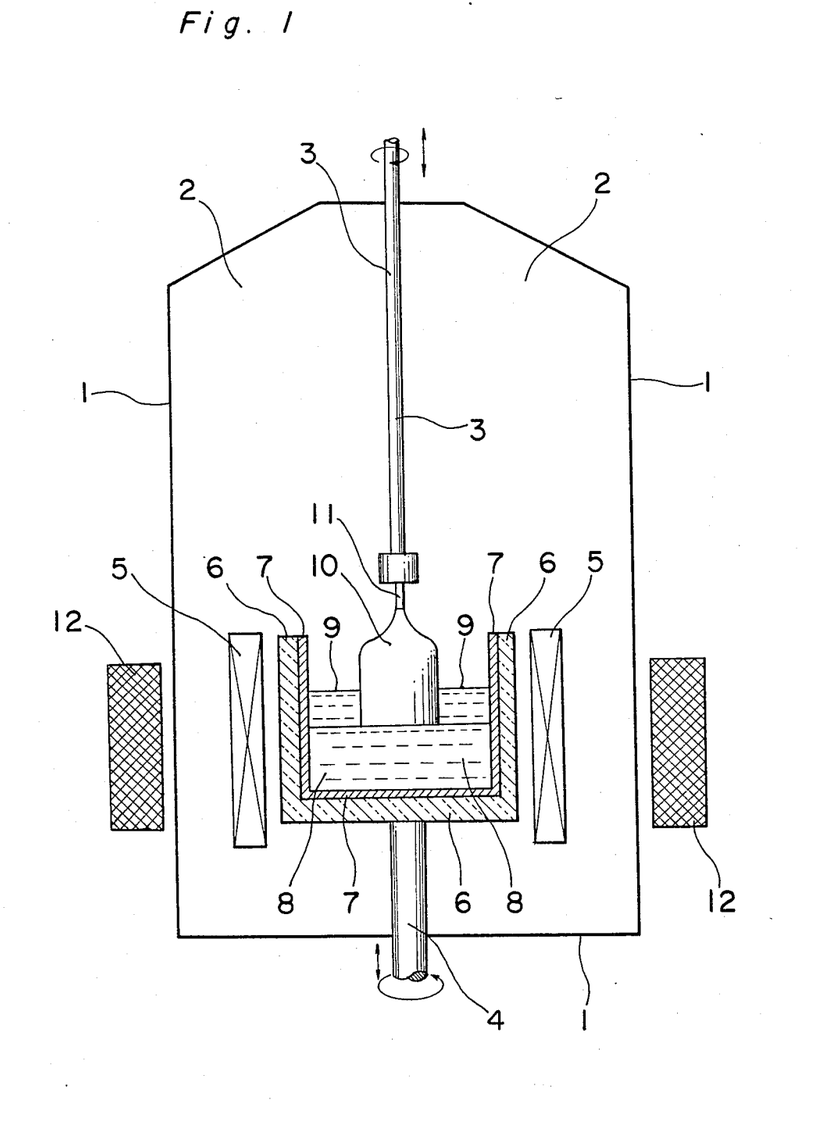
FIG. 1 is a cross sectional view of an apparatus for pulling up a GaAs single crystal according to the present invention.

FIG. 1 shows an example of an apparatus for pulling up a GaAs single crystal according to the present invention.

In a pressure vessel 1, inactive gas such as nitrogen, helium, argon and krypton is filled to a high pressure of 2 to 100 Atm.

A lower shaft 4 is freely rotated and moved up and down and supports a susceptor 6, in which a crucible 7 is contained. The crucible 7 is made of pyrolytic boron nitride (PBN). Instead, a quartz crucible may be used.

In the crucible 7, a GaAs raw material melt 8 containing an impurity such as In or the above-described impurity is charged and encapsulated with a liquid encapsulating layer 9 of $B_2O_3$ to prevent the dissipation of As. The melt 8 is heated by a carbon heater 5.

Above the vessel 1, an upper shaft 3 is vertically provided with, which shaft is freely rotated and moved up and down. To the lower end of the upper shaft 3, a GaAs seed crystal 11 is attached. The seed crystal 11 is dipped in the GaAs melt 8 and then the upper shaft 3 is pulled upwardly with rotating both the upper and lower shafts 3 and 4. A GaAs single crystal 10 containing the In impurity is pulled up. The apparatus to be used in the invention is the same as that used in the conventional LEC method except that magnets 12, 12 are provided with outside the pressure vessel 1 with the different poles facing each other.

The magnet may be any one that can produce a static magnetic field and, for example, a cylindrical solenoid type, a coaxial coil type, an iron core type, etc. The coil may be either superconductive or conductive one.

In the apparatus in FIG. 1, a horizontal magnetic field applying type is used. The magnetic field may be vertically applied.

With the magnets 12, 12, the magnetic field of, for example, at least 1,000 gauss is applied to the melt 8. By the action of the magnetic field, the apparent viscosity of the melt 8 is increase. Thus, the convection is suppressed and the thermal conduction becomes predominant. Since Rayleigh number is small, the melt is hardly disturbed. Although the convection is present, it is a stationary flow so that the height and area of the solid-liquid interface are not changed.

The preparation of a GaAs single crystal containing In as an impurity will be explained further in detail by way of example.

(A) GaAs melt containing In

There are several methods for the preparation of the GaAs melt containing In.

(1) Simple substances of Ga, As and In are charged in the crucible 7 and heated to a temperature of about 800° C. under a pressure of 50 atm or higher to produced a GaAs polycrystal containing In. This method may be referred to as a "direct synthesis method".

Since the simple substances of Ga, As and In having purity of at least 99.9999% are easily available, the polycrystal contains substantially no impurity other than In. Since In is isoelectronic with Ga, the electrical properties of the polycrystal are not affected by the addition of In so that a semi-insulating single crystal having a specific resistivity of at least $10^7$ ohm.cm is prepared. Such single crystal is suitable as a substrate for a GaAs integrated circuit.

(2) Firstly, the GaAs polycrystal not containing In is prepared in the crucible 7 from the simple substances of Ga and As. Before the single crystal is pulled up, In or In As is added to the polycrystal melt. In this case, a semi-insulating GaAs single crystal is also prepared.

(3) To the GaAs polycrystal prepared in a quartz reactor tube by the boat method, In or InAs and also $Ga_2O_3$ are added. By this method, a semi-insulating GaAs single crystal is prepared.

(4) To the GaAs polycrystal, In or InAs and additionally a p-type additive such as Zn, Cd, etc. are added. In this case, a p-type conductive GaAs single crystal is prepared.

(5) To the GaAs polycrystal, In or InAs and additionally an n-type additive such as Si, Te, etc. are added. In this case, an n-type conductive GaAs single crystal is prepared.

As described above, the GaAs raw material containing In may have various compositions and, accordingly, the n- or p- type conductive or semi-insulating GaAs single crystal containing In can be prepared.

According to the present invention, the thermal convection is suppressed by the high magnetic field applied to the raw material melt, so that the temperature distribution near the solid-liquid interface is well stabilized. Thus, the growth rate of the single crystal is substantially constant and variation of the In amount to be contained in the single crystal is small.

The growth striation generated by the fluctuation of the growth rate can be observed by the AB etching as explained in the above. The prepared single crystal is sliced parallelly with the growing axis and the sliced surface is etched with an etchant consisting of $AgNO_3$, $CrO_3$, HF and water. The GaAs ingot prepared by the method of the present invention does not show any growth striation, while that prepared by the conventional LEC method shows curved growth striation which are convex upwardly. This result will be theoretically analyzed.

For the raw material melt, the Navier-Stokes equation is solved. The density $\rho$ of the melt varies with the temperature. Expansion coefficient is $\alpha$.

The temperature is high at the lower portion and low at the upper portion with a temperature gradient $\beta$.

When a velocity vector is $u_i$, a coefficient of viscosity is $\eta$ and acceleration is g, $$\frac{\partial u_i}{\partial x_i} = 0 \tag{9}$$

$$\rho \frac{\partial u_i}{\partial t} = -g_i \alpha \rho \theta + \eta \frac{\partial}{\partial x_j}\left(\frac{\partial u_i}{\partial x_j} + \frac{\partial u_j}{\partial x_i}\right) \tag{10}$$

$$\rho c \frac{\partial \theta}{\partial t} = \lambda \frac{\partial^2 \theta}{\partial x_i^2} + \rho c w \tag{11}$$

$$g_i = (0, 0, g) \tag{12}$$

wherein $\theta$ is temperature fluctuation, c is specific heat, w is velocity fluctuation in the Z direction, and $\lambda$ is heat conductivity. When there is the same two suffixes i or j, all terms for i or j=1, 2 and 3 are to be summed. These equations are arranged as follows:

$$\frac{\partial}{\partial t}(\nabla^2 w) = g\alpha\left(\frac{\partial^2\theta}{\partial x^2} + \frac{\partial^2\theta}{\partial y^2}\right) + \nu\nabla^4 w \quad (13)$$

$$\frac{\partial\theta}{\partial t} = \beta w + \kappa\nabla^2\theta \quad (14)$$

wherein $\kappa$ is a diffusivity of heat ($\lambda/\rho c$) and $\nu$ is a kinetic viscosity coefficient.

These equations cannot be solved as such. Thus, assume a function in the form of exp(ikr) as the dependency in the x and y directions, namely in the r direction and a function in the form of exp(wt) as the time factor. When the real part of w is negative, equal to zero and positive, it means diminishing (stability), critical and disturbance, accordingly.

When the depth of the liquid is h, the boundary condition is given at z=0 and h.

Now, following relations are introduced:

$$Z = Z/h \quad (15)$$

$$a = kh \quad (16)$$

$$\xi = \omega h^2/\nu \quad (17)$$

$$D = d/dZ \quad (18)$$

Since w and $\theta$ except exp(ikr) and exp(wt) parts are the functions of Z alone, they are replaced with W and $\Theta$. Then, the following equations are derived:

$$(D^2 - a^2)(D^2 - a^2 - \xi)W = (g\alpha h^2/\nu)a^2\Theta \quad (19)$$

$$[D^2 - a^2 - (\nu/\kappa)\xi]\Theta = -(\beta/\kappa)h^2 W \quad (20)$$

When $\Theta$ is eliminated, and Rayleigh number as defined by the equation (1) is used, these are rewritten as follows:

$$(D^2-a^2)(D^2-a^2-\xi)[D^2-a^2-(\nu/\kappa)\xi]W = -Ra^2 W \quad (21)$$

It is apparent that the fluctuation in the Z direction is zero at Z=0 and 1. Therefore, assume the lowest mode solution as follows:

$$W = A\sin\pi Z \quad (22)$$

Thus, Rayleigh number is expressed as follows:

$$R = (\pi^2 + a^2)(\pi^2 + a^2 + \xi)[\pi^2 + a^2 + (\nu/\kappa)\xi]/a^2 \quad (23)$$

a is determined when the wave number k in the r direction is determined, which depends on size and shape of a container. When a certain mode is considered, a is a constant. If a is a constant, Rayleigh number increases as $\xi$, namely $\omega$ increases.

Figure 6:
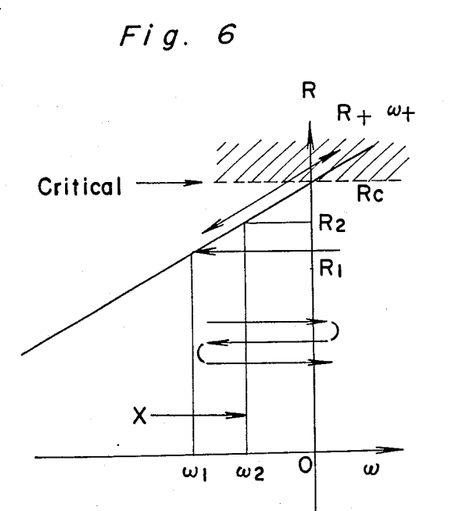
FIG. 6 shows the relation between $\omega$ and Rayleigh number.

FIG. 6 shows the relation of $\omega$ and Rayleigh number, in which the oblique line represents the equation (23). When $\omega$ is larger than zero, the solution is divergent, which corresponds to disturbance. R corresponding this solution is the critical Rayleigh number $R_c$. When $\omega$ is less than zero, the solution is convergent, which means the stationary motion.

Since the whole melt in the crucible is heated by the heater, Rayleigh number is not constant. R itself varies as time elapses.

Rayleigh number increases since the temperature difference between the upper and lower portions of the melt is not removed by the heat transfer with conduction and thus the temperature gradient gradually increases.

Assume that the initial condition is ($\omega_1, R_1$) and increases and reaches $R_c$ and finally exceeds it as R increases. Then, $\omega$ becomes positive and suddenly the melt becomes disturbed resulting in hard convection. Then, the temperature in the surface portion is lowered and that in the bottom portion is raised so that heat is equalized throughput the melt. As the result, the temperature gradient decreases and Rayleigh number also decreases to the condition ($\omega_1, R_1$). In this way, the state of the melt repeatedly shifts between the conditions ($\omega_1, R^1$) and ($\omega+, R_c+$). At each shifting, the temperature at the solid-liquid interface changes. Thus, the growth striations are formed.

However, when the high magnetic field is applied to the melt, the viscosity coefficient of the melt increases as above-described. Therefore, Rayleigh number R of the equation (1) is smaller than that without the magnetic field even if $\beta$ is constant.

Similarly, the heat conduction is weak and the temperature difference between the upper and lower portions increases due to heating by the heater. Then, $\beta$ and Rayleigh number increase and reach the condition ($\omega_2, R_2$). In this case, $\beta$ is so large that heat is vigorously transferred from the lower portion to the upper portion by the heat conduction. When the amount of heat transferred is equal to that generated by the heater, Rayleigh number does not increase any more and stabilized at ($\omega_2, R_2$). Since this is smaller than the critical Rayleigh number, the melt is in the stationary condition.

According to the present invention, instead of being shifted between the disturbed and stationary conditions, the stationary condition lasts and heat is transferred by the heat conduction. Therefore, the temperature at and the height of the solid-liquid interface are stabilized, while according to the conventional methods, the height of the solid-liquid interface changes due to shifting between the disturbed and stationary conditions.

As soon as In migrates into the solid phase, it starts to move toward the high temperature portion, that is toward the lower portion.

Since the upper shaft pulls up the single crystal upwardly at a constant rate v, a part of In remain in the crystal.

The force for drifting In downwardly is the sum of the gradient of chemical potential of In and the above-described compressive stress. Of course, In diffuses. The motion of In will satisfy the following equation:

$$\frac{\partial In}{\partial t} = D\frac{\partial^2 In}{\partial Z^2} + E\frac{\partial In}{\partial Z} \quad (24)$$

wherein D is a diffusion constant and E is a drifting force.

The diffusion term includes the components in the x and y directions but they are neglected for simplicity. The equation (24) is considered on the coordinate moving upwardly at the constant rate v.

When a cycle between the disturbed and stationary conditions is ($2\pi/\Omega$) and an amplitude of the variation of height of the solid-liquid interface is F, a boundary condition is a constant concentration of In ($I_0$). Since the boundary itself, however, varies, following boundary condition is given:

$$In = I_0 \quad (25)$$

at $Z_0 = F \sin \Omega t$. The solution of this equation is $$In = \frac{I_0}{\sqrt{4D\pi}} \int_{-\infty}^{t} \frac{\exp\left[-\frac{1}{4D(t-t_0)}(Z - F\sin\Omega t + E(t-t_0))^2\right]}{\sqrt{t-t_0}} dt \quad (26)$$

This is integration of a Gaussian distribution function.

Since, actually, the temperature of the crystal is gradually lowered, the drift is terminated as the temperature is lowered. That is, D and E are zero.

If the temperature starts from the boundary, is lowered by $\tau = t - t_0$ for a certain period of time and then stopped, coordinate $<Z>$ at which peak of the In distribution is present may be determined. Many peak points are produced as the single crystal is pulled up. Since the pulling rate is v, the distance L between the adjacent two peaks is expressed as follows:

$$L = 2\pi v/\Omega \quad (27)$$

These peaks appear as the growth striation. In other words, the In concentration periodically varies with the period L. These striations are different from those appearing in the non-doped GaAs single crystal and bring about new problem.

Portions along the growth striations contain In in a higher concentration. Since In has the same valency as Ga, number of carriers is the same but In might act as a neutral scateromg center for electrons. If the In concentration is high, the electron mobility might be decreased.

If the diffusion centers are unevenly distributed in the same wafer, the characteristics of the devices made on the wafer widely vary. In case of FET, the pinch-off voltage varies.

According to the present invention, since the convection of the melt is suppressed by the applied magnetic field, the height of the solid-liquid interface and the temperature distribution do not change. Therefore, uneven distribution of In is not found in the single crystal prepared by the method of the invention, and In is uniformly distributed on the same wafer.

If In does not move at height $Z_0$ from the solid-liquid interface, the equation (26) is integrated by the saddle point method to give the following approximate equation:

$$In(Z) = \frac{I_0}{E} \exp\left[-\frac{E[Z_0 - F\sin(\Omega Z/\beta)]}{D}\right] \quad (28)$$

With the approximation that $Z_0 > F$, the average In concentration $<In>$ is expressed as follows:

$$<In> = \frac{I_0}{E} \exp\left(-\frac{EZ_0}{D}\right) \quad (29)$$

When the fluctuation of the In distribution is defined by the following equation:

$$\sigma(In) = \frac{\sqrt{\overline{(In - <In>)^2}}}{<In>} \quad (30)$$

the following equation is obtained with the same approximation:

$$\sigma(In) = \frac{EF}{2D} \quad (31)$$

Although the diffusion constant D and the drift constant E are the functions of the temperature, they are common in the preparation of GaAs single crystal by any of the LEC method. F represents the amplitude of the oscilation of the solid-liquid interface due to shifting between the disturbed and stationary conditions.

The thus obtained result is the fluctuation in the Z direction. However, the constant temperature lines are not perpendicular to the Z axis but the curved lines as shown in FIG. 3. If such the fluctuation is present along the growing axis (ie. the Z axis), the fluctuation of In appears on the wafer which is sliced from the ingot on the plane perpendicular to the Z axis.

According to the present invention, the amplitude F is controlled as desired and can be made zero by applying the strong magnetic field to the raw material melt. Further, it is possible to control the fluctuation $\sigma(In)$ less than 0.2. Since the fluctuation of the electron scattering center is small when the fluctuation of In is small, variation of the characteristics of the devices integrated on the wafer is small.

In addition to the above advantage, the single crystal prepared by the invention has other advantage.

For instance, EPD in the wafer having a diameter not less than 40 mm sliced from the single crystal is less than 10,000/cm² except at the periphery and the center.

Figure 2:
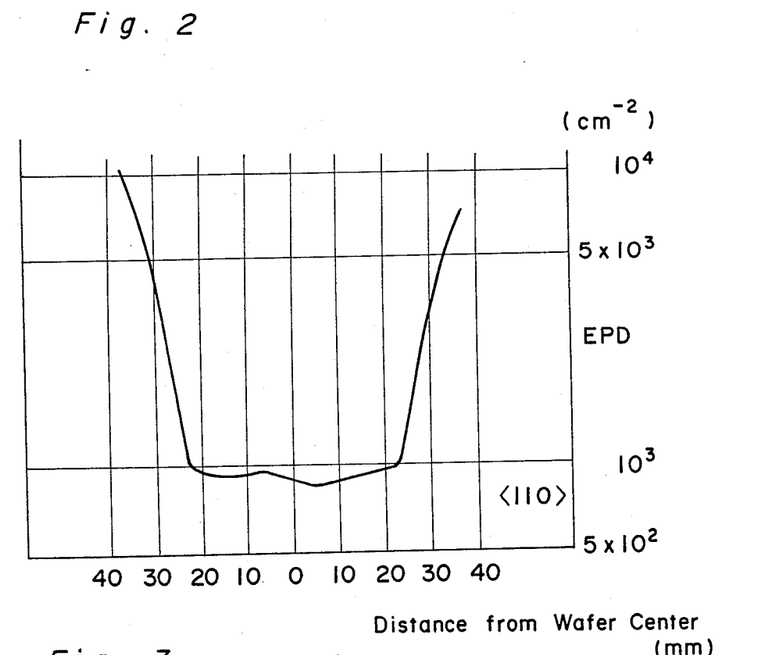
FIG. 2 shows EPD in the wafer prepared in Example.

FIG. 2 shows EPD in the <110> direction of the wafer having a diameter of 76 mm which is sliced from the single crystal ingot prepared according to the present invention. Although, at the periphery, EPD is 10,000/cm², in other area, it is less than 1,000/cm².

Since In is isoelectronic with Ga, a semi-insulating GaAs single crystal is prepared.

By adding a conductive additive such as Si together with In, it is possible to prepare a controlled conductive single crystal having less dislocation density than that obtained by adding each additive. In this case, the electrical characteristics such as carrier density can be determined by the amount of the conductive additive.

Example

By means of the apparatus of FIG. 1, a GaAs single crystal was grown under the following conditions:

(1) Conditions for Direct Synthesis of GaAs Polycrystal Containing In

Purity of the raw materials was 99.9999% (6N).
Charged amounts of the materials were as follows:

Ga: 1,800 g
As: 2,000 g
In: 1.5% by weight
$B_2O_3$: 600 g (Liquid encapsulant)
Crucible: PBN made
Synthetic temperature: about 800° C.
Nitrogen gas pressure: 60 atm.

(2) Conditions for Pulling up

Pressure (nitrogen gas): 7 atm.
Pulling rate: 5 mm/Hr.
Rotation rate of the upper shaft: 8 rpm.
Rotation rate of the lower shaft: 12 rpm.
Temperature gradient in $B_2O_3$: 35° C./cm.

(3) Magnetic Field

The magnetic Field was generated by the horizontal iron core type magnet. Magnetic induction near the GaAs melt was 1,500 gauss. The effect of magnetic field was nearly same as the vertical field generated by a solenoidal coil.

(4) Pulled up GaAs Single Crystal

Under the above conditions, a single crystal ingot having a diameter of 76 mm and a length of about 170 mm was pulled up. An average concentration of In in the front portion near the seed crystal was $4.2 \times 10^{19}/cm^3$.

EPD was measured on a wafer which was sliced from the thus prepared ingot and etched with a potassium hydroxide solution at 420° C. for 20 minutes. Except the periphery of about 15 mm wide, EPD in the wafer was $1,000/cm^2$ or less.

No growth striation was found by the AB etching. Thus, the growth of the single crystal was uniform and the In concentration was homogeneous.

Specific resistivity of the crystal was $5 \times 10^7$ ohm.cm and semi-insulating.

The thus prepared wafer had very high qualities as a substrate for an integrated circuit.

What is claimed is:

1. A GaAs single crystal containing at least one impurity selected from the group consisting of B, Si, S, Te and In in a concentration of at least $10^{15}/cm^3$, wherein fluctuation of the concentration of the impurity is not larger than 20% in a plane perpendicular to a growth direction of the single crystal.

2. A GaAs single crystal according to claim 1, wherein the concentration of the impurity is at least $10^{17}/cm^3$.

3. A GaAs single crystal according to claim 1, wherein the impurity is IN.

4. A GaAs single crystal according to claim 1, which further contains an n- or p- type additive impurity.

5. A GaAs single crystal according to claim 1, the cross section of which does not show any growth striation.

* * * * *